(12) United States Patent
Sandhu et al.

(10) Patent No.: US 9,735,359 B2
(45) Date of Patent: Aug. 15, 2017

(54) METHODS OF FORMING A MEMORY CELL MATERIAL, AND RELATED METHODS OF FORMING A SEMICONDUCTOR DEVICE STRUCTURE, MEMORY CELL MATERIALS, AND SEMICONDUCTOR DEVICE STRUCTURES

(71) Applicant: Micron Technology, Inc., Boise, ID (US)

(72) Inventors: Gurtej S. Sandhu, Boise, ID (US); John A. Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 102 days.

(21) Appl. No.: 14/259,556

(22) Filed: Apr. 23, 2014

(65) Prior Publication Data
US 2015/0311437 A1 Oct. 29, 2015

(51) Int. Cl.
*H01L 45/00* (2006.01)
*C23C 16/455* (2006.01)

(52) U.S. Cl.
CPC .... *H01L 45/1616* (2013.01); *C23C 16/45525* (2013.01); *H01L 45/04* (2013.01); *H01L 45/08* (2013.01); *H01L 45/14* (2013.01); *H01L 45/145* (2013.01)

(58) Field of Classification Search
CPC ................ H01L 29/42332; H01L 29/42348
See application file for complete search history.

(56) References Cited

U.S. PATENT DOCUMENTS

| | | | |
|---|---|---|---|
| 6,656,835 B2 | 12/2003 | Marsh et al. | |
| 6,673,701 B1 | 1/2004 | Marsh et al. | |
| 7,575,978 B2 | 8/2009 | Kraus et al. | |
| 8,314,456 B2 | 11/2012 | Marsh et al. | |
| 2003/0235064 A1 | 12/2003 | Batra et al. | |
| 2005/0159017 A1* | 7/2005 | Kim | C23C 16/345 438/791 |
| 2005/0227017 A1 | 10/2005 | Senzaki et al. | |
| 2007/0032091 A1* | 2/2007 | Heald | H01L 21/28273 438/758 |

(Continued)

FOREIGN PATENT DOCUMENTS

JP 2007528616 A 10/2007

OTHER PUBLICATIONS

International Search Report from ISA/KR for International Patent Application No. PCT/US2015/026486, mailed Jul. 29, 2015, three (3) pages.

(Continued)

*Primary Examiner* — Jesse Y Miyoshi
*Assistant Examiner* — David Spalla
(74) *Attorney, Agent, or Firm* — TraskBritt

(57) ABSTRACT

A method of forming a memory cell material comprises forming a first portion of a dielectric material over a substrate by atomic layer deposition. Discrete conductive particles are formed on the first portion of the dielectric material by atomic layer deposition. A second portion of the dielectric material is formed on and between the discrete conductive particles by atomic layer deposition. A memory cell material, a method of forming a semiconductor device structure, and a semiconductor device structure are also described.

28 Claims, 4 Drawing Sheets

(56) References Cited

U.S. PATENT DOCUMENTS

| | | | |
|---|---|---|---|
| 2007/0092989 A1* | 4/2007 | Kraus | B82Y 10/00 438/99 |
| 2007/0238259 A1* | 10/2007 | Bhat | H01L 27/10852 438/381 |
| 2008/0211039 A1* | 9/2008 | Wang | B82Y 10/00 257/412 |
| 2008/0246078 A1* | 10/2008 | Huo | B82Y 10/00 257/324 |
| 2008/0296650 A1* | 12/2008 | Ahn | H01L 21/28194 257/310 |
| 2009/0173991 A1* | 7/2009 | Marsh | B22F 9/12 257/324 |
| 2009/0189215 A1 | 7/2009 | Samanta et al. | |
| 2009/0273016 A1* | 11/2009 | Majhi | B82Y 10/00 257/316 |
| 2009/0302365 A1* | 12/2009 | Bhattacharyya | B82Y 10/00 257/298 |
| 2011/0133268 A1* | 6/2011 | Min | B82Y 10/00 257/324 |
| 2012/0168853 A1 | 7/2012 | Ji et al. | |

OTHER PUBLICATIONS

Written Opinion from ISA/KR for International Patent Application No. PCT/US2015/026486, mailed Jul. 29, 2015, ten (10) pages.
Taiwanese Search Report from Taiwanese Application No. 104113096, dated Jun. 3, 2017, 1 page.

* cited by examiner

METHODS OF FORMING A MEMORY CELL MATERIAL, AND RELATED METHODS OF FORMING A SEMICONDUCTOR DEVICE STRUCTURE, MEMORY CELL MATERIALS, AND SEMICONDUCTOR DEVICE STRUCTURES

FIELD

The disclosure, in various embodiments, relates generally to the field of semiconductor device design and fabrication. More specifically, the disclosure relates to methods of forming a memory cell material, and to related methods of forming a semiconductor device structure, memory cell materials, and semiconductor device structures.

BACKGROUND

Integrated circuit designers often desire to increase the level of integration or density of elements within an integrated circuit by reducing the size of the individual elements and by reducing the separation distance between neighboring elements. In addition, integrated circuit designers often desire to design architectures that are not only compact, but offer performance advantages, as well as simplified designs.

A relatively common integrated circuit device is a memory device. A memory device may include a memory array having a number of memory cells arranged in a grid pattern. One type of memory cell is a resistive memory cell, such as a resistive random access memory (RRAM) cell, which stores data by switching between electrical resistance states. For example, for binary data storage, a high-resistance state of the resistive memory cell may be read as logical "1," while a low-resistance state of the resistive memory cell may be read as logical "0." Switching between resistance states may be achieved by applying different physical signals (e.g., voltage, current, etc.) across the resistive memory cell.

There is continuing interest in the development of methodologies by which memory cell (e.g., resistive memory cell) dimensions can be scaled down to realize higher density memory devices (e.g., resistive memory devices) and form higher capacity electronic devices and systems. Unfortunately, scaling down memory cell dimensions to increase memory device density can result in problems, such as undesirable electrical coupling effects.

It would, therefore, be desirable to have improved methods and structures that facilitate scaling down memory cell dimensions to form higher density memory devices while mitigating problems (e.g., adverse electrical coupling effects) conventionally associated with scaling down memory cell dimensions to form higher density memory devices.

DETAILED DESCRIPTION

Figure 1:
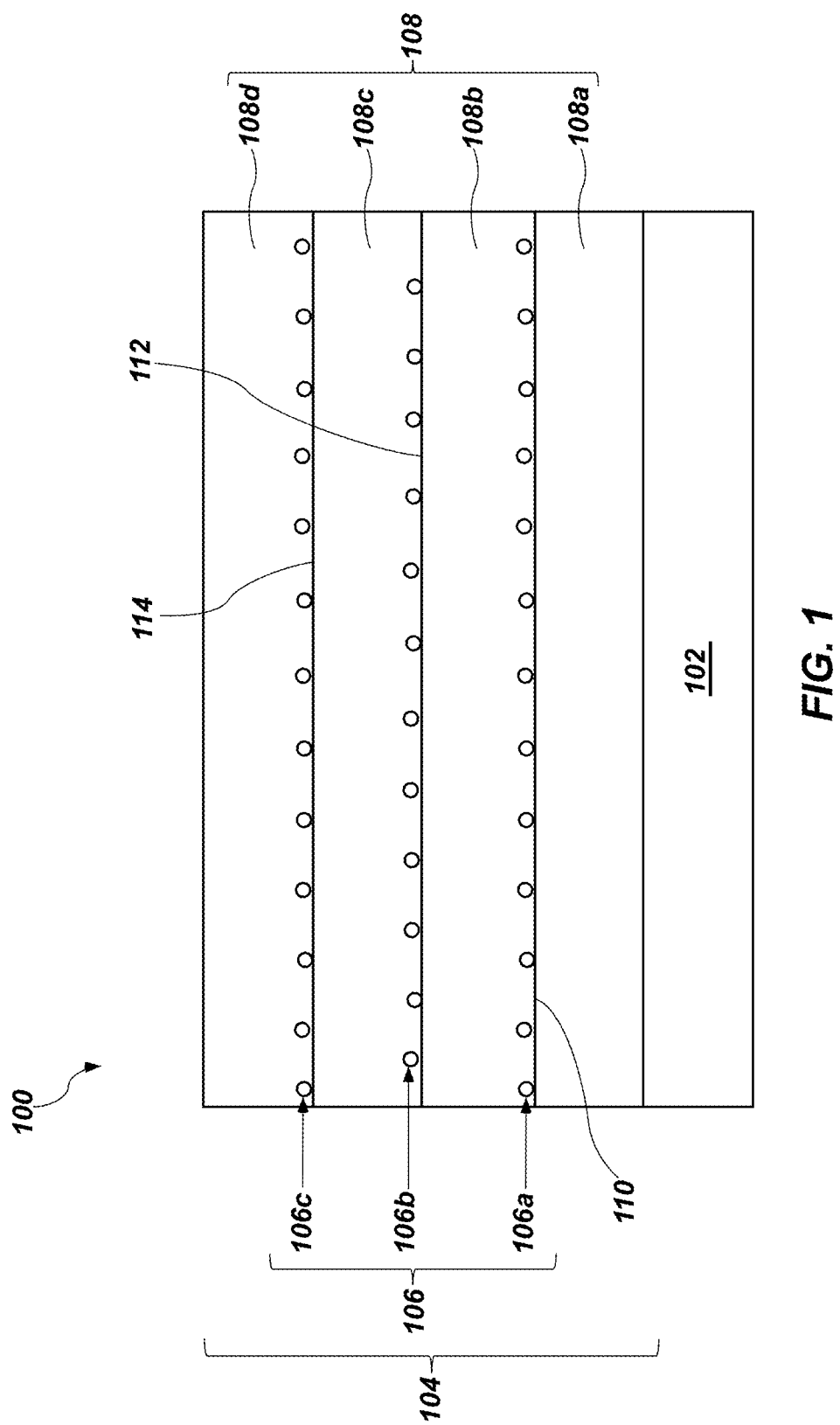
FIG. 1 illustrates a partial cross-sectional view of a semiconductor device structure, in accordance with embodiments of the disclosure.

Methods of forming a memory cell material (e.g., a resistive memory cell material) by atomic layer deposition (ALD) are disclosed, as are related methods of forming semiconductor device structures, related memory cell materials, and related semiconductor device structures. As used herein, the term "atomic layer deposition" or "ALD" means and includes a vapor deposition process in which a plurality of separate deposition cycles are conducted in a chamber. ALD includes, but is not limited to, atomic layer epitaxy (ALE), molecular beam epitaxy (MBE), gas source MBE, organometallic MBE, and chemical beam epitaxy when performed with alternating pulses of precursors and purge (i.e., inert) gases. In some embodiments, a portion of a dielectric material is formed on or over a substrate by an ALD process, discrete (e.g., separate, isolated, spaced) conductive particles are formed by an ALD process on or over the portion of the dielectric material, and at least one other portion of the dielectric material is formed on or over the discrete conductive particles by an ALD process. At least a portion of the discrete conductive particles may be formed on the portion of the dielectric material by adsorbing conductive material precursors to a surface of the portion of the dielectric material, and then reacting the adsorbed conductive material precursors with at least one of additional conductive material precursors and a separate reactant. Optionally, at least one additional portion of the discrete conductive particles may be formed on or over the at least one other portion of the dielectric material by an ALD process, and at least one additional portion of the dielectric material may be formed on or over the at least one additional portion of the discrete conductive particles by an ALD process. Different portions of the dielectric material may be formed from the same material as or a different material than one another, and different portions of the discrete conductive particles may be the same material as or a different material than one another. The memory cell material may be used as a thin film for a semiconductor device structure, such as a memory device structure (e.g., a resistive memory cell, such as a RRAM cell). The methods disclosed herein may facilitate scaling, performance, and stability improvements in semiconductor device structures (e.g., memory cells) and semiconductor devices (e.g., memory devices) including a memory cell material.

The following description provides specific details, such as material compositions and processing conditions, in order to provide a thorough description of embodiments of the present disclosure. However, a person of ordinary skill in the art would understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the present disclosure are described in detail below. Additional acts to form a complete semiconductor device from the semiconductor device structures may be performed by conventional fabrication techniques. Also note, any drawings presented herein are for illustrative purposes only, and are thus not drawn to scale. Additionally, elements common between figures may retain the same numerical designation.

As used herein, the singular forms "a," "an," and "the" are intended to include the plural forms as well, unless the context clearly indicates otherwise.

As used herein, the term "and/or" includes any and all combinations of one or more of the associated listed items.

As used herein, any relational term, such as "first," "second," "over," "under," "on," "underlying," "upper," "lower," etc., is used for clarity and convenience in understanding the disclosure and accompanying drawings and does not connote or depend on any specific preference, orientation, or order, except where the context clearly indicates otherwise.

As used herein, the ten "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

FIG. 1 is simplified partial cross-sectional view illustrating a semiconductor device structure 100 formed in accordance with an embodiment of the disclosure. The semiconductor device structure 100 may include a substrate 102 and a memory cell material 104. The memory cell material 104 may be formed on or over the substrate 102. As used herein, the term "substrate" means and includes a base material or construction upon which additional materials are formed. The substrate 102 may be a semiconductor substrate, a base semiconductor layer on a supporting structure, a metal electrode, or a semiconductor substrate having one or more materials, structures, or regions formed thereon. Previous process acts may have been conducted to form materials, regions, or junctions in the base semiconductor structure or foundation. The substrate 102 may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate 102 may be doped or undoped. By way of non-limiting example, the substrate 102 may comprise at least one of silicon, silicon dioxide, silicon with native oxide, silicon nitride, a carbon-containing silicon nitride, glass, semiconductor, metal oxide, metal, a titanium nitride, a carbon-containing titanium nitride, tantalum, a tantalum nitride, a carbon-containing tantalum nitride, niobium, a niobium nitride, a carbon-containing niobium nitride, molybdenum, a molybdenum nitride, a carbon-containing molybdenum nitride, tungsten, a tungsten nitride, a carbon-containing tungsten nitride, copper, cobalt, nickel, iron, aluminum, and a noble metal.

The memory cell material 104 is formed of and includes discrete conductive particles 106 dispersed in a dielectric material 108. The discrete conductive particles 106 may be positioned (e.g., located, disposed) on at least one surface of the dielectric material 108, such as on an upper surface of at least one portion of the dielectric material 108. For example, as depicted in FIG. 1, a first portion 106a of the discrete conductive particles 106 may be positioned on an upper surface 110 of a first portion 108a of the dielectric material 108, and a second portion 108b of the dielectric material 108 may be positioned on or over the first portion 106a of the discrete conductive particles 106. Accordingly, the first portion 106a of the discrete conductive particles 106 may be positioned vertically between the first portion 108a of the dielectric material 108 and the second portion 108b of the dielectric material 108. As used herein, each of the terms "vertical" and "longitudinal" means and includes extending in a direction substantially perpendicular to the substrate 102, regardless of the orientation of the substrate 102. Conversely, as used herein, each of the terms "horizontal" and "lateral" means and includes extending in a direction substantially parallel to the substrate 102, regardless of the orientation of the substrate 102. Furthermore, additional portions of the discrete conductive particles 106 and the dielectric material 108 may, optionally, be positioned on or over the second portion 108b of the dielectric material 108. For example, as shown in FIG. 1, a second portion 106b of the discrete conductive particles 106 may be positioned on an upper surface 112 of the second portion 108b of the dielectric material 108, and a third portion 108c of the dielectric material 108 may be positioned on or over the second portion 106b of the discrete conductive particles 106. In addition, a third portion 106c of the discrete conductive particles 106 may be positioned on an upper surface 114 of the third portion 108c of the dielectric material 108, and a fourth portion 108d of the dielectric material 108 may be positioned on or over the third portion 106c of the discrete conductive particles 106.

While various embodiments herein describe or illustrate the memory cell material 104 as including three portions (i.e., the portions 106a, 106b, and 106c) of the conductive particles 106 and four portions (i.e., the portions 108a, 108b, 108c, and 108d) of the dielectric material 108, the memory cell material 104 may, alternatively, include a different number of portions of the conductive particles 106 and/or a different number of portions of the dielectric material 108. For example, the memory cell material 104 may include a single portion (e.g., the portion 106a) of the conductive particles 106 disposed vertically between two portions (e.g., the portions 108a and 108b) of the dielectric material 108, may include two portions (e.g., the portions 106a and 106b) of the conductive particles 106 and three portions (e.g., the portions 108a, 108b, and 108c) of the dielectric material 108 in a vertically stacked and alternating relationship relative to one another, or may include greater than four portions of the conductive particles 106 and greater than five portions of the dielectric material 108 in a vertically stacked and alternating relationship relative to one another (e.g., greater than or equal to five portions of the conductive particles 106, and greater than or equal to six portions of the dielectric material 108; greater than or equal to ten portions of the conductive particles 106, and greater than or equal to eleven portions of the dielectric material 108; greater than or equal to twenty portions of the conductive particles 106, and greater than or equal to twenty-one portions of the dielectric material 108).

The dielectric material 108 may be fainted of and include an oxide material (e.g., silicon dioxide, phosphosilicate glass, borosilicate glass, borophosphosilicate glass, fluoro-silicate glass, titanium dioxide, zirconium dioxide, hafnium dioxide, tantalum oxide, magnesium oxide, aluminum oxide, a combination thereof), a nitride material (e.g., silicon nitride), an oxynitride material (e.g., silicon oxynitride), amphorous carbon, or a combination thereof (e.g., a laminate of at least two of the foregoing). In some embodiments, the dielectric material 108 is $SiO_2$. Each of the different portions (e.g., each of the first portion 108a, the second portion 108b, the third portion 108c, and the fourth portion 108d) of the dielectric material 108 may be formed of and include substantially the same material as one another (e.g., may have substantially the same material composition), or at least one of the different portions of the dielectric material 108 may be formed of and include a different material (e.g., may have a different material composition) than at least one other of the different portions of the dielectric material 108. As a non-limiting example, each of the different portions of the dielectric material 108 may be formed of and include silicon dioxide ($SiO_2$). As another non-limiting example, each of the different portions of the dielectric material 108 may be formed of and include silicon nitride ($Si_3N_4$). As a further non-limiting example, at least one of the different portions (e.g., the first portion 108a) of the dielectric material 108 may be formed of and include $SiO_2$, and at least one other of the different portions (e.g., the second portion 108b) of the dielectric material 108 may be formed of and include $Si_3N_4$. In some embodiments, the different portions of the dielectric material 108 are formed of and include at least one of $SiO_2$ and $Si_3N_4$. In addition, each of the different portions of the dielectric material 108 may be formed of and include a single dielectric material (e.g., $SiO_2$ or $Si_3N_4$), or at least one of the different portions of the dielectric material 108 may be formed of and include multiple dielectric materials (e.g., $SiO_2$ and $Si_3N_4$). As a non-limiting example, at least one of the different portions of the dielectric material 108 may comprise at least one dielectric oxide film (e.g., a $SiO_2$ film) on or over at least one dielectric nitride film (e.g., a $Si_3N_4$ film). As another non-limiting example, at least one of the different portions of the dielectric material 108 may comprise at least one dielectric nitride film (e.g., a $Si_3N_4$ film) on or over at least one dielectric oxide film (e.g., a $SiO_2$ film). As described in further detail below, the dielectric material 108, including each of the different portions thereof, may be selected at least partially based on the chemistry (e.g., chemically reactive groups) of precursors utilized in at least one ALD process to form the discrete conductive particles 106.

The dielectric material 108, including each of the different portions thereof, may have any suitable thickness. The overall thickness of the dielectric material 108 may be selected based on the desired dimensions and operational voltage range of the semiconductor device structure 100. By way of non-limiting example, the overall thickness of the dielectric material 108 may be less than or equal to about 1000 Angstroms (Å), such as less than or equal to about 500 Å, less than or equal to about 250 Å, less than or equal to about 100 Å, less than or equal to about 50 Å, or less than or equal to about 25 Å. A semiconductor device structure 100 having a lower operational voltage range may exhibit a lower overall thickness and may include fewer portions (e.g., the first portion 108a, and the second portion 108b) as compared to a semiconductor device structure having a higher operational voltage range. In addition, the different portions (e.g., the first portion 108a, the second portion 108b, the third portion 108c, and the fourth portion 108d) of the dielectric material 108 may each independently have a desired thickness. By way of non-limiting example, the different portions of the dielectric material 108 may each independently have a thickness of less than or equal to about 10 monolayers, such as less than or equal to about 8 monolayers, less than or equal to about 5 monolayers, or less than or equal to about 3 monolayers. The different portions of the dielectric material 108 may each have substantially the same thickness, or at least one of the different portions of the dielectric material 108 may have a different thickness than at least one other of the different portions of the dielectric material 108. In some embodiments, the different portions of the dielectric material 108 each independently have a thickness of within a range of from about 3 monolayers to about 5 monolayers.

The discrete conductive particles 106 may be adsorbed (e.g., attached, bound) to at least one surface of the dielectric material 108. For example, different portions (e.g., the first portion 106a, the second portion 106b, and the third portion 106c) of the conductive particles 106 may be adsorbed to the upper surfaces of different portions of the dielectric material 108 by way of at least one of chemisorption (also known as "chemical adsorption") and physisorption (also known as "physical adsorption"). As used herein, the terms "chemisorb" and "chemisorption" mean and include a mechanism wherein a material (e.g., the discrete conductive particles 106) is adsorbed to at least one surface (e.g., the upper surfaces 110, 112, and 114) of another material (e.g., the dielectric material 108) by way of chemical bonding, such as covalent bonding or ionic bonding. In turn, as used herein, the terms "physisorb" and "physisorption" mean and include a mechanism wherein a material (e.g., the discrete conductive particles 106) is adsorbed to at least one surface (e.g., the upper surfaces 110, 112, and 114) of another material (e.g., the dielectric material 108) by way of weak intermolecular forces, such as Van der Waals forces. As a non-limiting example, as shown in FIG. 1, the first portion 106a of the discrete conductive particles 106 may be chemisorbed or physisorbed to the upper surface 110 of the first portion 108a of the dielectric material 108, the second portion 106b of the discrete conductive particles 106 may be chemisorbed or physisorbed to the upper surface 112 of the second portion 108b of the dielectric material 108, and the third portion 106c of the discrete conductive particles 106 may be chemisorbed or physisorbed to the upper surface 114 of the third portion 108c of the dielectric material 108. In some embodiments, different portions (e.g., the first portion 106a, the second portion 106b, and the third portion 106c) of the conductive particles 106 are chemisorbed to the upper surfaces of different portions of the dielectric material 108. Thus, different portions of the discrete conductive particles 106 may be interposed (e.g., intercalated) between different portions of the dielectric material 108. For example, the first portion 106a of the conductive particles 106 may be intercalated between the first portion 108a and the second portion 108b of the dielectric material 108, the second portion 106b of the conductive particles 106 may be intercalated between the second portion 108b and the third portion 108c of the dielectric material 108, the third portion 106c of the conductive particles 106 may be intercalated between the third portion 108c and the fourth portion 108d of the dielectric material 108, and so on.

The discrete conductive particles 106 may be formed of at least one conductive material, such as at least one conductive metal material. As used herein, the term "metal material" means and includes an alkali metal, an alkaline earth metal, a transition metal (e.g., titanium, zirconium, hafnium, vanadium, niobium, tantalum, chromium, molybdenum, tungsten, manganese, iron, ruthenium, rhenium, cobalt, rhodium, osmium, nickel, palladium, platinum, copper, silver, gold, zinc, cadmium, etc.), a post-transition metal (e.g., aluminum, gallium, indium, tin, lead, bismuth, etc.), a metalloid (e.g., boron, silicon, germanium, arsenic, antimony, etc.), conductive oxides thereof, conductive nitrides thereof, conductive carbides thereof, or combinations thereof. Each of the discrete conductive particles 106 may include a single metal (e.g., alkali metal, alkaline earth metal, transition metal, post-transition metal, metalloid) species, or may include multiple metal species (e.g., a metal alloy). The conductive material of the discrete conductive particles 106 may be selected at least partially based on a desired retention state charge loss of the discrete conductive particles 106. In some embodiments, at least a portion of the discrete conductive particles 106 are independently formed of and include an elemental metal (e.g., an alkali metal, an alkaline earth metal, a transition metal, a post-transition metal, a metalloid), such as at least one of platinum (Pt), tantalum (Ta), ruthenium (Ru), rhodium (Rh), copper (Cu), aluminum (Al), and cobalt (Co). Each of the discrete conductive particles 106 may be substantially free of dielectric material. For example, dielectric oxides (e.g., dielectric oxides of alkali metals, alkaline earth metals, transition metals, post-transition metals, and metalloids) may be substantially absent from each of the discrete conductive particles 106. In some embodiments, each of the discrete conductive particles 106 is formed of and includes at least one metal resistant to oxidation (e.g., platinum, rhodium, cobalt). In additional embodiments, at least a portion (e.g., substantially all) of the discrete conductive particles 106 are substantially free of oxygen. In further embodiments, at least a portion of the discrete conductive particles 106 are formed of and include at least one metal that forms a conductive metal oxide upon oxidation (e.g., ruthenium). As described in further detail below, the discrete conductive particles 106, including each of the different portions thereof, may be selected at least partially based on the chemistry (e.g., chemically reactive groups) of precursors utilized in at least one ALD process to form the dielectric material 108.

Each of the discrete conductive particles 106 may have a desired size. The discrete conductive particles 106 may comprise, for example, a plurality of nanoparticles. As used herein the term "nanoparticle" means and includes a particle having an average particle width or diameter measured within the nanometer range (e.g., from about 0.3 nanometer to about 1000 nanometers). By way of non-limiting example, each of the discrete conductive particles 106 may independently have a diameter within a range of from about 0.3 nanometer (nm) to about 100 nm, such as from about 0.3 nm to about 50 nm, from about 0.3 nm to about 25 nm, from about 0.3 nm to about 10 nm, or from about 0.3 nm to about 5 nm. In some embodiments, each of the discrete conductive particles 106 independently has a diameter within a range of from about 1 nm to about 5 nm. In addition, the discrete conductive particles 106 may each independently have a desired shape, such as at least one of a substantially spherical shape, a substantially hemispherical shape, a substantially ellipsoidal shape, or another shape appropriate for arrangement at atomic scale (e.g., a face-centered cubic arrangement, a hexagonal closed-packed arrangement, a rhombohedral arrangement). In some embodiments, each of the discrete conductive particles 106 has a substantially spherical shape.

The memory cell material 104 may include a homogeneous distribution of the discrete conductive particles 106, or may include a heterogeneous distribution of discrete conductive particles 106. For example, if each of the discrete conductive particles 106 has substantially the same size, shape, and material composition, the memory cell material 104 may include a homogeneous distribution of the discrete conductive particles 106, wherein the size, shape, and material composition of each of the discrete conductive particles 106 is substantially the same throughout the longitudinal dimensions and the lateral dimensions of the memory cell material 104. Conversely, if at least one of the discrete conductive particles 106 has one or more of a different size, a different shape, and a different material composition than at least one other of the discrete conductive particles 106, the memory cell material 104 may have a heterogeneous distribution of the discrete conductive particles 106, wherein at least one of the size, shape, and material composition of the discrete conductive particles 106 varies throughout one or more of the longitudinal dimensions and the lateral dimensions of the memory cell material 104. The homogeneity or heterogeneity of the discrete conductive particles 106 of the memory cell material 104 may be substantially undetectable by visual detection, but may be detectable by conventional spectroscopy or spectrometry techniques.

In some embodiments, discrete conductive particles 106 located along the same lateral plane within the memory cell material 104 are substantially the same (e.g., have substantially the same material composition, size, and shape) as one another, but are different (e.g., have a different material composition, a different size, and/or a different shape) than discrete conductive particles 106 located along at least one other lateral plane within the memory cell material 104. For example, with reference to FIG. 1, the particles of the first portion 106*a* (e.g., each located along the same lateral plane defined by the upper surface 110 of the first portion 108*a* of the dielectric material 108) of the discrete conductive particles 106 may exhibit substantially the same material composition, size, and shape as one another, but may exhibit at least one of a different material composition, a different size, and a different shape than the particles of at least one of the second portion 106*b* (e.g., each located along the same lateral plane defined by the upper surface 112 of the second portion 108*b* of the dielectric material 108) and the third portion 106*c* (e.g., each located along the same lateral plane defined by the upper surface 114 of the third portion 108*c* of the dielectric material 108) of the discrete conductive particles 106. Thus, the discrete conductive particles 106 may be homogeneously distributed through the lateral dimensions of the memory cell material 104, and may be heterogeneously distributed through the longitudinal dimensions of the memory cell material 104. In additional embodiments, all of the discrete conductive particles 106 within the memory cell material 104 are substantially the same as one another.

As shown in FIG. 1, the discrete conductive particles 106 are substantially isolated from one another. Adjacent discrete conductive particles 106 located along the same lateral plane within the memory cell material 104 may be substantially uniformly laterally spaced. The space between the adjacent discrete conductive particles 106 may be filled with the dielectric material 108. For example, laterally adjacent particles of the first portion 106*a* of the discrete conductive particles 106 may be substantially uniformly spaced from one another by a first distance, and the spaces between the laterally adjacent particles may be filled with the second portion 108*b* of the dielectric material 108. In turn, adjacent discrete conductive particles 106 located along different lateral planes within the memory cell material 104 may be longitudinally spaced from another by the thickness of the portion of the dielectric material 108 longitudinally therebetween. For example, the particles of first portion 106*a* of the discrete conductive particles 106 may be longitudinally spaced from the particles of second portion 106*b* of the discrete conductive particles 106 by the thickness of the second portion 108b of the dielectric material 108 located longitudinally therebetween. In addition, the lateral spacing of discrete conductive particles 106 located along different lateral planes within the memory cell material 104 may be substantially the same or may be different. For example, the lateral spacing of the particles of first portion 106a of the discrete conductive particles 106 may be the same as or different than the lateral spacing of the particles of the second portion 106b of the discrete conductive particles 106 and/or the third portion 106c of the discrete conductive particles 106. Furthermore, the discrete conductive particles 106 of different lateral planes within the memory cell material 104 may be at least partially laterally offset from one another. For example, at least some of the particles of the first portion 106a of the discrete conductive particles 106 may be longitudinally unaligned (e.g., staggered) with the particles of the second portion 106b of the discrete conductive particles 106 most proximate thereto. The longitudinal misalignment of the discrete conductive particles 106 of different adjacent lateral planes (e.g., the discrete conductive particles 106 of the first portion 106a and of the second portion 106b; the discrete conductive particles 106 of the second portion 106b and of the third portion 106c) within the memory cell material 104 may prevent the formation of stacked weakness paths within the memory cell material 104.

Accordingly, a memory cell material of the disclosure comprises a first portion of a dielectric material over a substrate, discrete conductive particles over the first portion of the dielectric material, at least a portion of the discrete conductive particles adsorbed to a surface of the first portion of the dielectric material, and a second portion of a dielectric material on and between the at least a portion of the discrete conductive particles.

Furthermore, a semiconductor device structure of the disclosure comprises a memory cell material on a substrate and comprising at least three vertically adjacent portions of a dielectric material, and discrete conductive particles interposed between each of the at least three vertically adjacent portions of a dielectric material.

The memory cell material 104 may be formed on or over the substrate 102 by ALD. ALD provides a nucleation mechanism for forming the discrete conductive particles 106. In addition, forming the memory cell material 104 by ALD may facilitate control of transitions (e.g., boundaries, interfaces) between different materials (e.g., between different portions of the dielectric material 108, and between different portions of the dielectric material 108 and the discrete conductive particles 106). As a result of such control, the memory cell material 104 may have engineered transitions amongst the various internal components thereof (e.g., the discrete conductive particles 106, the dielectric material 108) and with the other components of the semiconductor device structure 100 (e.g., the substrate 102). The ALD-based formation of the memory cell material 104 may include at least two ALD-based dielectric formation processes and at least one ALD-based conductive particle formation process. The ALD-based dielectric formation processes and the ALD-based conductive particle formation process may be conducted in sequence and in repetition to form the memory cell material 104 to a desired thickness. For example, with reference to FIG. 1, a first ALD-based dielectric formation process may be used to form the first portion 108a of the dielectric material 108 on the substrate 102, an ALD-based conductive particle formation process may be used to form (e.g., chemisorb) the first portion 106a of the discrete conductive particles 106 on the upper surface 110 of the first portion 108a of the dielectric material 108, a second ALD-based dielectric formation process may be used to form the second portion 108b of the dielectric material 108 on exposed surfaces of the first portion 106a of the discrete conductive particles 106 and the first portion 108a of the dielectric material 108, and so on.

The ALD-based dielectric formation processes may include conducting alternating pulses of at least one dielectric material precursor and at least one dielectric-material-forming reactant, with intervening pulses of at least one inert gas (e.g., nitrogen, argon, helium, neon, krypton, xenon, and/or other gases that, although not inert, behave as inert under the conditions of the dielectric formation process). The dielectric material precursor may comprise an organometallic compound including a complex of metal (e.g., Ti, Zr, Hf, V, Nb, Ta, Cr, Mo, W, Mn, Fe, Ru, Os, Co, Rh, Ir, Ni, Pd, Pt, Cu, Ag, Au, Zn, Cd, B, Al, Ga, In, Si, Ge, Sn, Pb, As, Sb, Bi, or a combination thereof) and at least one ligand formulated to react with the dielectric-material-forming reactant to form at least a portion of the dielectric material 108. The dielectric material precursor may be commercially available or may be synthesized by conventional techniques. As a non-limiting example, the dielectric material precursor may comprise a silicon-containing precursor including silicon and at least one ligand comprising one or more of hydrogen, nitrogen, and carbon, such as at least one of a disilane (e.g., hexachlorodisilane) and trisilyamine. As another non-limiting example, the dielectric material precursor may comprise an aluminum-containing precursor including aluminum and at least one ligand comprising one or more of hydrogen, nitrogen, and carbon, such as least one of trimethylaluminum (TMA), trisobutylaluminum (TIBA), dimethylaluminum hydride (DMAH), and another alane. In some embodiments, the dielectric material precursor is TMA.

The dielectric-material-forming reactant may be selected based on the chemical properties (e.g., metal species, ligands) of the dielectric material precursor. For example, depending on the chemical properties of the dielectric material precursor, the dielectric-material-forming reactant may comprise at least one of an oxidizing agent (e.g., oxygen, ozone, water, hydrogen peroxide, nitrous oxide), and a nitridizing agent (e.g., ammonia, hydrazine). In some embodiments, the dielectric-material-forming reactant is at least one of water ($H_2O$), oxygen ($O_2$), and ammonia ($NH_3$).

The metal of the dielectric material precursor and the dielectric-material-forming reactant interact (e.g., react) with each other and eliminate the ligand(s) of the dielectric material precursor during the dielectric formation processes. Depending on the chemistry of the precursors used to form the dielectric material 108 (i.e., including the different portions thereof), additional reaction gases may be utilized to form one or more portions of the dielectric material 108.

The same precursors (e.g., the same dielectric material precursor and the same dielectric-material-forming reactant) or different precursors (e.g., at least one different dielectric material precursor, and/or at least one different dielectric-material-forming reactant) may be used to form different portions (e.g., at least two of the first portion 108a, the second portion 108b, the third portion 108c, the fourth portion 108d) of the dielectric material 108. In some embodiments, different precursors are used to form at least two different portions of the dielectric material 108. In addition, the same inert gas or different inert gases may be provided (e.g., pulsed) between the different pulses of the dielectric material precursor(s) and the dielectric-materialforming reactant(s) to form different portions (e.g., at least two of the first portion 108a, the second portion 108b, the third portion 108c, the fourth portion 108d) of the dielectric material 108. In some embodiments, the inert gas utilized to form at least one of the portions of the dielectric material 108 is different than the inert gas utilized to form at least one other of the portions of the dielectric material 108.

One or more of the precursors of the dielectric formation processes (e.g., the dielectric material precursor, and/or the dielectric-material-forming reactant) may be in a solid, liquid, or gaseous form at room temperature and atmospheric pressure. If the precursors are in a solid or liquid form at room temperature and atmospheric pressure, the precursors may be vaporized before being introduced to exposed components of the semiconductive device structure 100. Vaporization of the precursors may be accomplished by conventional techniques, which are not described in detail herein.

Selection of the precursors for a given portion of the dielectric material 108 may depend on the desired properties of the memory cell material 104, on the other components of the memory cell material 104, and on the temperature at which the ALD-based dielectric formation process associated therewith is conducted. The precursors utilized to form the dielectric material 108, including the different portions thereof, are selected to be compatible with the various components of the memory cell material 104 exposed to the precursors during the ALD-based dielectric formation process. As used herein, the term "compatible" means and includes that a material does not react, break down, or absorb another material in an unintended way, and also does not impair the chemical and/or mechanical properties of the another material in an unintended way. For example, the precursors utilized to form the dielectric material 108 may be selected such that the precursors do not react with, break down, or absorb the discrete conductive particles 106 exposed thereto (if any) during the ALD-based dielectric formation processes. In addition, the precursors used to form the dielectric material 108 are selected to be substantially thermally stable at the operating temperatures (e.g., the temperature of the substrate 102) of the ALD-based dielectric formation processes, so as to substantially limit thermal decomposition of the precursors. In some embodiments, the precursors utilized to form at least a portion of the dielectric material 108 are selected to be thermally stable up to a temperature of about 200° C., such as within a range of from about 70° C. to about 200° C., or from about 70° C. to about 150° C. For example, the precursors utilized to form at least a portion of the dielectric material 108 may comprise at least one of hexachlorodisilane (HCDS) and TMA. In additional embodiments, the precursors utilized to form at least a portion of the dielectric material 108 are selected to be thermally stable at a higher temperature range, such as a temperature of greater than or equal to about 350° C., such as from about 350° C. to about 500° C., or from about 400° C. to about 500° C. Furthermore, in addition to reactivity and volatility considerations, the temperature at which the ALD-based dielectric formation processes are conducted may depend on the thermal budget of the semiconductor device structure 100 in which the memory cell material 104 is to be used. To prevent damage to other components of the semiconductor device structure 100, the other components formed on, in, or over the substrate 102 should be compatible with the conditions (e.g., materials, temperatures, pressures) of the ALD-based dielectric formation processes.

In some embodiments, a work piece (not shown) such as a carrier to which the substrate 102 is mounted may be placed into (or remain in from previous processing) a chamber (not shown). The chamber may be a conventional ALD reactor, examples of which are known in the art and, therefore, are not described in detail herein. The dielectric material precursor may be introduced into the chamber and may chemisorb to a surface of the substrate 102. The dielectric material precursor may be of sufficient volatility and reactivity to react with the surface of the substrate 102. The dielectric material precursor may be introduced into the chamber with an inert carrier gas (e.g., He) to form a mixture of the dielectric material precursor and the inert carrier gas. The dielectric material precursor may be introduced into the chamber for an amount of time sufficient for the reaction to occur, such as from about 0.1 second to about 60 seconds, such as from about 1 second to 60 seconds, or from about 2 seconds to about 60 seconds. The dielectric material precursor may be introduced into the chamber at a flowrate within a range of from about 1 standard cubic centimeters per minute (sccm) to about 100 sccm, a temperature (e.g., a substrate temperature) within a range of from about 20° C. to about 500° C. (e.g., from about 70° C. to about 200° C., from about 350° C. to about 500° C.), and a pressure within a range of from about 0.0005 Torr to about 5 Torr (e.g., from about 0.0005 Torr to about 1 Torr, about 0.05 Torr). In some embodiments, a monolayer of the dielectric material precursor is formed on the surface of the substrate 102 as a result of the chemisorption on the surface of substrate 102. The monolayer may be self-terminating since a surface of the monolayer may be non-reactive with the dielectric material precursor used in forming the monolayer.

Subsequent pulsing with inert gas removes excess dielectric material precursor (e.g., dielectric material precursor not chemisorbed to the surface of the substrate 102) from the chamber. Purging the chamber also removes volatile byproducts produced during the formation of the chemisorbed dielectric material precursor. The inert gas may be introduced into the chamber, for example, for from about 2 seconds to about 120 seconds, such as from about 5 seconds to about 120 seconds. After purging, the chamber may be evacuated, or "pumped," to remove gases, such as the excess dielectric material precursor and/or the volatile byproducts. For example, the excess dielectric material precursor may be purged from the chamber by techniques including, but not limited to, contacting the substrate 102 with the inert gas and/or lowering the pressure in the chamber to below the deposition pressure of the dielectric material precursor to reduce a concentration of the dielectric material precursor contacting the substrate 102 and/or chemisorbed dielectric material precursor. The inert gas and the amount (e.g., duration) of purging may be selected based on the properties (e.g., molecular weight, volatility, reaction byproducts) of the dielectric material precursor. The pump and purge sequences may be repeated multiple times.

After purging, the dielectric-material-forming reactant may be introduced into the chamber and may chemically react with exposed surfaces of the chemisorbed dielectric material precursor. The dielectric-material-forming reactant may be of sufficient volatility and reactivity to react with the chemisorbed dielectric material precursor. The dielectric-material-forming reactant may be introduced into the chamber for an amount of time sufficient for the reaction to occur, such as from about 0.1 second to about 30 seconds, such as from about 5 seconds to about 30 seconds. For example, the dielectric-material-forming reactant may be introduced into the chamber at a flowrate within a range of from about 1 sccm to about 100 sccm, a substrate 102 temperature within a range of from about 20° C. and about 500° C. (e.g., from about 70° C. to about 200° C., from about 350° C. to about 500° C.), and a pressure within a range of from about 0.0005 Torr to about 5 Torr (e.g., from about 0.0005 Torr to about 1 Torr, about 0.05 Torr). In some embodiments, the reaction between the chemisorbed dielectric material precursor and the dielectric-material-forming reactant is accomplished by applying RF power while the dielectric-material-forming reactant is introduced to the chemisorbed dielectric material precursor. The applied RF power may, for example, be within a range of from about 20 Watts (W) to about 300 W, such as from about 20 W to about 200 W, from about 20 W to about 100 W, from about 30 W to about 80 W, from about 40 W to about 70 W, or from about 50 W to about 60 W. The RF power may be applied at at least one frequency within a range of from about 40 kilohertz (kHz) to about 13.56 megahertz (MHz). In additional embodiments, the reaction between the chemisorbed dielectric material precursor and the dielectric-material-forming reactant is accomplished without the application of RF power.

Reaction byproducts and/or excess dielectric-material-forming reactant may be removed from the chamber utilizing an additional pump and purge cycle. The additional pump and purge cycle may be similar to the pump and purge cycle previously described for removing excess dielectric material precursor and/or volatile byproducts following the formation of the chemisorbed dielectric material precursor. The additional pump and purge cycle to remove the reaction byproducts and/or the excess dielectric-material-forming reactant may be the same as or different than the pump and purge cycle used to remove the excess dielectric material precursor and/or the volatile byproducts. In some embodiments, the additional pump and purge cycle lasts from about 5 seconds to about 30 seconds.

The ALD-based dielectric formation process described above may be repeated any number of times to form a desired thickness of at least a portion (e.g., the first portion 108a) of the dielectric material 108 on the substrate 102. By way of non-limiting example, the ALD-based dielectric formation process may be repeated in sequence from about 2 times to about 10 times to form the first portion 108a of the dielectric material 108 to desired thickness. In addition, the ALD-based dielectric formation process described above may be utilized to form multiple portions of the dielectric material 108. For example, after forming at least a portion of the discrete conductive particles 106 (e.g., the first portion 106a of the discrete conductive particles 106) on the upper surface 110 of the first portion 108a of the dielectric material 108 (e.g., as described below), an additional ALD-based dielectric formation process may be utilized to form the second portion 108b of the dielectric material 108 on exposed surfaces of the discrete conductive particles 106 and the first portion 108a of the dielectric material 108. The additional ALD-based dielectric formation process may be the same as (e.g., utilize the same precursors, inert gases, and processing parameters) or may be different than (e.g., utilize at least one of different precursors, different inert gases, and/or different processing parameters) the ALD-based dielectric formation process utilized to form the first portion 108a of the dielectric material 108.

Using ALD processes to form the dielectric material 108, including the different portions thereof, facilitates desired surface termination of the dielectric material 108, facilitating the formation of discrete conductive particles 106 exhibiting desired properties (e.g., material compositions, sizes, shapes, spacing) on surfaces of the dielectric material 108 (e.g., the upper surface 110 of the first portion 108a of the dielectric material 108, the upper surface 112 of the second portion 108b of the dielectric material 108, the upper surface 114 of the third portion 108c of the dielectric material 108). In addition, using ALD processes to form the dielectric material 108 facilitates the formation of distinct boundaries between the dielectric material 108 and the discrete conductive particles 106 dispersed therein.

The ALD-based conductive particle formation process may include conducting alternating and/or simultaneous pulses of at least one conductive material precursor and at least one conductive-material-forming reactant, with intervening and/or subsequent pulses of an inert gas (e.g., nitrogen, argon, helium, neon, krypton, xenon, and/or other gases that, although not inert, behave as inert under the conditions of the dielectric formation process). The conductive material precursor may comprise an organometallic compound including a complex of metal (e.g., Ti, Zr, Hf, V, Nb, Ta, Cr, Mo, W, Mn, Fe, Ru, Os, Co, Rh, Ir, Ni, Pd, Pt, Cu, Ag, Au, Zn, Cd, B, Al, Ga, In, Si, Ge, Sn, Pb, As, Sb, Bi, or a combination thereof) and at least one ligand. In some embodiments, the metal is at least one of Pt, Ta, Ru, Rh, Cu, Al, and Co. The ligand may be selected based on the desired properties of the discrete conductive particles 106. The size (e.g., molecular weight) and chemical properties (e.g., reactive groups) of the ligand may at least partially determine the size, shape, and spacing of the discrete conductive particles 106 formed using the conductive particle formation process. For example, larger (e.g., higher molecular weight) ligands may result in the formation of discrete conductive particles 106 exhibiting greater lateral spacing relative to one another as compared to conductive particles formed using conductive material precursors having smaller (e.g., lower molecular weight) ligands. In addition, different ligand reactive groups may result in the formation of different sizes (e.g., larger or smaller) of the discrete conductive particles 106 and/or different distribution densities (e.g., increased or decreased) of the discrete conductive particles 106. Different ligands may react with different conductive-material-forming reactants in different ways to control (e.g., modify, such as increase or decrease) the size and/or the distribution density of the discrete conductive particles 106. The conductive material precursor may be commercially available or may be synthesized by conventional techniques. In some embodiments, the conductive material precursor is at least one of (trimethyl)methylcyclopentadienyl platinum, ethyl-cyclopentadienyldicarbonyl ruthenium, tricarbonyl(1,3-cyclo-hexadiene) ruthenium, tetrakis(dimethylamido) tantalum, cyclopentadienyldicarbonyl rhodium, dicarbonylcyclopentadienyl cobalt, cupric hexafluoroacetylacetonate, cupric(N,N' diisopropyl 2-dimethylamine amidinate), tris-hexamethyldisilazane aluminum, diethyl aluminum chloride, dimethylaluminum hydride, and tetrakis (dimethylamido) aluminum.

The conductive-material-forming reactant may be selected based on the chemical properties (e.g., metal composition, ligand) of the conductive material precursor. For example, depending on the chemical properties of the conductive material precursor, the conductive-material-forming reactant may comprise at least one of a reducing agent (e.g., formic acid, hydrogen, oxalic acid, hydrogen, $NH_3$) and an oxidizing agent (e.g., $O_2$, ozone, $H_2O_2$, hydrogen peroxide, nitrous oxide). In some embodiments, the conductive-material-forming reactant comprises at least one of formic acid ($CH_2O_2$), oxalic acid ($C_2H_2O_4$), hydrogen ($H_2$), $NH_3$, and $O_2$.

The metal of the conductive material precursor and the conductive-material-forming reactant interact (e.g., react) with each other and eliminate the ligand(s) of the conductive material precursor during the conductive particle formation process. In some embodiments, the conductive material precursor and the conductive-material-forming reactant are selected such that reactions between the conductive material precursor and the conductive-material-forming reactant do not result in the formation of discrete conductive particles 106 including a dielectric material (e.g., a dielectric oxide). For example, the reactant may comprise a reducing agent (e.g., $CH_2O_2$, $C_2H_2O_4$, $H_2$, $NH_3$) that reacts with the conductive material precursor to form discrete conductive particles 106 (e.g., metal particles) substantially free of dielectric metal oxides. Depending on the chemistry of the precursors used to form the dielectric material 108 (i.e., including the different portions thereof), additional reaction gases may be utilized to form one or more portions of the dielectric material 108.

In additional embodiments, the conductive-material-forming reactant may be omitted from the ALD-based conductive particle formation process. For example, depending of the conductive material precursor, the ALD-based conductive particle formation process may include performing one or more pulses of the conductive material precursor, with one or more subsequent pump and purge cycles utilizing an inert gas (e.g., nitrogen, argon, helium, neon, krypton, xenon, and/or other gases that, although not inert, behave as inert under the conditions of the dielectric formation process). Put another way, the conductive material precursor may be sufficiently reactive with itself under the conditions (e.g., temperature, pressure) of the ALD-based conductive particle formation process to form at least a portion of the discrete conductive particles 106 without the use of a separate conductive-material-forming reactant (e.g., a separate reducing reactant, a separate oxidizing reactant). For example, the ligand of a first conductive material precursor may react with the ligand of a second conductive material precursor (i.e., the same as or different than the first conductive material precursor) to form discrete conductive particles 106 formed of and including the metal of the first conductive material precursor and the metal of the second conductive material precursor. Depending on the characteristics of the conductive material precursor, omitting the use of at least an oxidizing reactant to form at least a portion of the discrete conductive particles 106 may substantially limit or even prevent the formation of discrete conductive particles 106 including dielectric metal oxides.

The same precursors (e.g., the same conductive material precursor; and the same conductive-material-forming reactant, if used) or different precursors (e.g., at least one conductive material precursor; and/or at least one different conductive-material-forming reactant, if used) may be used to form different portions (e.g., at least two of the first portion 106a, the second portion 106b, the third portion 106c) of the discrete conductive particles 106. In some embodiments, different precursors are used to form at least two portions of the discrete conductive particles 106. In addition, the same inert gas or different inert gases may be provided (e.g., pulsed) between the different pulses of the conductive material precursor(s) and/or the conductive-material-forming reactant(s) (if used) to form different portions (e.g., at least two of the first portion 106a, the second portion 106b, the third portion 106c) of the discrete conductive particles 106. In some embodiments, the inert gas utilized to form at least one of the portions of the discrete conductive particles 106 is different than the inert gas utilized to form at least one other of the portions of the discrete conductive particles 106.

One or more of the precursors of the conductive particle formation process (e.g., the conductive material precursor; and/or the conductive-material-forming reactant, if used) may be in a solid, liquid, or gaseous form at room temperature and atmospheric pressure. If the precursors are in a solid or liquid form at room temperature and atmospheric pressure, the precursors may be vaporized before being introduced to exposed components of the semiconductive device structure 100. Vaporization of the precursors of the conductive particle formation process may be accomplished by conventional techniques, which are not described in detail herein.

Selection of the precursors for any given portion of the discrete conductive particles 106 may depend on the desired properties of the memory cell material 104, on the other components of the memory cell material 104, and on the temperature at which the conductive particle formation process to be conducted. The precursors utilized to form the discrete conductive particles 106, including the different portions thereof, are selected to be compatible with the various components of the memory cell material 104 exposed to the precursors during the conductive particle formation process. For example, the precursors utilized to form the discrete conductive particles 106 may be selected such that the precursors not react, break down, or absorb the dielectric material 108 exposed thereto during the conductive particle formation process. In addition, the precursors (e.g., the conductive material precursor) utilized to form the discrete conductive particles 106 are selected to be substantially thermally stable at the operating temperatures (e.g., the substrate 102 temperature) of the ALD-based conductive particle formation process, so as to substantially limit thermal decomposition of the precursors. In some embodiments, the precursors utilized to form at least a portion of the discrete conductive particles 106 are selected to be thermally stable at up to a temperature of about 350° C., such as within a range of from about 200° C. to about 350° C., or from about 250° C. to about 320° C. For example, the conductive material precursor may be selected to comprise at least one of (trimethyl)methylcyclopentadienyl platinum; tricarbonyl (1,3-cyclo-hexadiene)ruthenium; dicarbonylcyclopentadienyl rhodium; an amine salt of at least one of Pt, Ru, and Rh; and an amidinate salt of at least one of Pt, Ru, and Rh. In additional embodiments, the precursors utilized to form at least a portion of the discrete conductive particles 106 are selected to be thermally stable at a higher temperature range, such as a temperature of greater than about 350° C., such as greater than or equal to about 400° C., greater than or equal to about 500° C., or from about 400° C. to about 500° C. For example, the conductive material precursor may be selected to comprise dicarbonylcyclopentadienyl cobalt. Furthermore, in addition to reactivity and volatility considerations, the temperature at which the ALD-based conductive particle formation process is conducted may depend on the thermal budget of the semiconductor device structure 100 in which the memory cell material 104 is to be used. To prevent damage to other components of the semiconductor device structure 100, the other components formed on, in, or over the substrate 102 should be compatible with the conditions (e.g., materials, temperatures, pressures) of the ALD-based conductive particle formation process.

In some embodiments, the conductive material precursor may be introduced into a chamber (e.g., the same chamber used to form at least a portion of the dielectric material 108, or a different chamber) containing the semiconductive device structure 100 including the dielectric material 108 on or over the substrate 102, and may chemisorb to a surface of the dielectric material 108 (e.g., the upper surface 110 of the first portion 108a of the dielectric material 108). The conductive material precursor may be of sufficient volatility and reactivity to react with the surface of the dielectric material 108. The conductive material precursor may be introduced into the chamber with an inert carrier gas (e.g., He) to form a mixture of the conductive material precursor and the inert carrier gas. The conductive material precursor may be introduced into the chamber for an amount of time sufficient for the reaction to occur, such as from about 0.2 second to about 120 seconds, such as from about 1 second to 90 seconds, from about 1 second to 60 seconds, or from about 2 seconds to about 60 seconds. The conductive material precursor may be introduced into the chamber at a flowrate within a range of from about 1 sccm and about 100 sccm, a temperature (e.g., a substrate temperature) within a range of from about 20° C. and about 500° C. (e.g., from about 20° C. to about 300° C., from about 50° C. to about 200° C., from about 70° C. to about 120° C.), and a pressure within a range of from about 0.0005 Torr to about 1 Torr (e.g., about 0.05 Torr). In some embodiments, a monolayer of the conductive material precursor is formed on the surface of the dielectric material 108 as a result of the chemisorption on the surface of dielectric material 108. The monolayer may be self-terminating since a surface of the monolayer may be non-reactive with the conductive material precursor used in forming the monolayer.

Subsequent pulsing with inert gas removes excess conductive material precursor (e.g., conductive material precursor not chemisorbed to a surface of the dielectric material 108) from the chamber. Purging the chamber also removes volatile byproducts produced during the formation of the monolayer of the conductive material precursor. The inert gas may be the same as or different than another inert gas utilized in the ALD process to form the memory cell material 104 (e.g., an inert gas utilized to form at least a portion of the dielectric material 108). The inert gas may be introduced into the chamber, for example, for from about 2 seconds to about 180 seconds, such as from about 5 seconds to about 180 seconds, or from about 5 seconds to about 120 seconds. After purging, the chamber may be evacuated, or "pumped," to remove gases, such as the excess dielectric material precursor and/or the volatile byproducts. For example, the excess conductive material precursor may be purged from the chamber by techniques including, but not limited to, contacting the dielectric material 108 with the inert gas and/or lowering the pressure in the chamber to below the deposition pressure of the conductive material precursor to reduce a concentration of the conductive material precursor contacting the dielectric material 108 and/or chemisorbed conductive material precursor. The inert gas and the amount (e.g., duration) of purging may be selected based on the properties (e.g., molecular weight, volatility, reaction byproducts) of the conductive material precursor. The pump and purge sequences may be repeated multiple times.

After purging, the conductive-material-forming reactant may be introduced into the chamber and may chemically react with exposed surfaces of the chemisorbed conductive material precursor. The conductive-material-forming reactant may be of sufficient volatility and reactivity to react with the chemisorbed conductive material precursor. The conductive-material-forming reactant may be introduced into the chamber for an amount of time sufficient for the reaction to occur, such as from about 0.1 second to about 120 seconds, such as from about 1 second to about 60 seconds, or from about 5 seconds to about 30 seconds. For example, the conductive-material-forming reactant may be introduced into the chamber at a flowrate within a range of from about 1 sccm to about 100 sccm, a substrate 102 temperature within a range of from about 20° C. and about 500° C. (e.g., from about 50° C. to about 200° C., from about 300° C. to about 400° C.) and a pressure within a range of from about 0.0005 Torr to about 1 Torr (e.g., about 0.05 Torr). In some embodiments, the reaction between the chemisorbed conductive material precursor and the conductive-material-forming reactant is accomplished by applying RF power while the conductive-material-forming reactant is introduced to the chemisorbed conductive material precursor. The applied RF power may, for example, be within a range of from about 20 Watts (W) to about 100 W, such as from about 30 W to about 80 W, from about 40 W to about 70 W, or from about 50 W to about 60 W. In additional embodiments, the reaction between the chemisorbed conductive material precursor and the conductive-material-forming reactant is accomplished without the application of RF power. In further embodiments, such as in embodiments wherein the conductive material precursor is reactive with the chemisorbed conductive material precursor under the conditions of the ALD-based conductive particle formation process, a conductive-material-forming reactant separate from the conductive material precursor is not introduced into the chamber to chemically react with the chemisorbed conductive material precursor.

Reaction byproducts and/or excess conductive-material-forming reactant may be removed from the chamber utilizing an additional pump and purge cycle. The additional pump and purge cycle may be similar to the pump and purge cycle previously described for removing excess conductive material precursor and/or volatile byproducts following the formation of the chemisorbed conductive material precursor. The additional pump and purge cycle to remove the reaction byproducts and/or the excess conductive-material-forming reactant may be the same as or different than the pump and purge cycle used to remove the excess conductive material precursor and/or the volatile byproducts. In some embodiments, the additional pump and purge cycle lasts from about 5 seconds to about 180 seconds.

The ALD-based conductive particle formation process described above may be repeated any number of times to form the discrete conductive particles 106 to desired particle sizes and desired particle densities on the dielectric material 108 (e.g., on the upper surface 110 of the first portion 108a of the dielectric material 108). By way of non-limiting example, depending on the characteristics of the precursors (e.g., the conductive material precursor; and/or the conductive-material-forming reactant, if used) and the inert gas, the ALD-based conductive particle formation process may be repeated in sequence from about 2 times to about 500 times to form the discrete conductive particles 106 (e.g., the first portion 106a of the discrete conductive particles 106 on the upper surface 110 of the first portion 108a of the dielectric material 108) to a desired average particle size and a desired particle distribution density. In addition, the ALD-based conductive particle formation process described above may be utilized to form multiple portions of the discrete conductive particles 106. For example, after forming the second portion 108b of the dielectric material 108 on the first portion 106a of the discrete conductive particles 106 (as well as on portions of the upper surface 110 of the first portion 108a of the dielectric material 108 that remain uncovered by the first portion 106a of the discrete conductive particles 106), an additional ALD-based conductive particle formation process may be utilized to form the second portion 106b of the discrete conductive particles 106 on the upper surface 112 of the second portion 108b of the dielectric material 108. The additional ALD-based conductive particle formation process may be the same as (e.g., utilize the same precursors, inert gases, and processing parameters) or may be different than (e.g., utilize at least one of different precursors, different inert gases, and/or different processing parameters) the ALD-based conductive particle formation process utilized to form the first portion 106a of the discrete conductive particles 106.

By using the ALD-based conductive particle formation process of the disclosure, the discrete conductive particles 106 may be formed without the use of a plasma treatment process. Put another way, the discrete conductive particles 106 may be formed through a non-plasma-assisted ALD process (e.g., through the conductive particle formation process described above). The size, shape, and distribution density (e.g., spacing) of the discrete conductive particles 106 may depend on the properties (e.g., ligand reactivity, ligand molecular weight) of the conductive material precursors used to form the discrete conductive particles 106, on the deposition (e.g., pulse) times of the conductive material precursors, and on the temperatures (e.g., the chamber temperature, the substrate 102 temperature) utilized in the ALD-based (e.g., non-plasma-assisted ALD-based) conductive particle formation process.

In additional embodiments, at least one plasma treatment process may be utilized to enhance or facilitate the formation of at least a portion of the discrete conductive particles 106. For example, at least in embodiments wherein the characteristics (e.g., precursors, such as the conductive material precursor; temperatures; pressures; flowrates; exposure times; etc.) of the ALD-based conductive particle formation process result in the formation of an at least partially continuous (e.g., unitary) film of conductive material, a plasma treatment process may be utilized to convert at least a portion of the at least partially continuous film of conductive material into the discrete conductive particles 106. As another example, in embodiments wherein the characteristics of the ALD-based conductive particle formation process result in the formation of the discrete conductive particles 106, a plasma treatment process may be utilized to modify at least one of the material composition, the size, the shape, and the distribution density (e.g., spacing) of the discrete conductive particles 106. The plasma treatment process may include exposing the at least partially continuous film of conductive material and/or the discrete conductive particles 106 to at least one plasma. The plasma may be selected based upon the properties of the at least partially continuous film of conductive material and/or the properties of the discrete conductive particles 106. By way of non-limiting example, the plasma may comprise at least one of an inert gas plasma (e.g., an argon plasma), a nitrogen-containing plasma, a reducing plasma, and a rare gas plasma. In some embodiments, the plasma treatment process includes exposing the at least partially continuous film of conductive material and/or the discrete conductive particles 106 to an argon (Ar) plasma.

In some embodiments, discrete Pt particles are formed on at least one surface of the dielectric material 108 using an ALD process. By way of non-limiting example, the surface of the dielectric material 108 may be exposed to (trimethyl)methylcyclopentadienyl platinum and $O_2$ to form the discrete Pt particles on the surface of the dielectric material 108. The surface of the dielectric material 108 may, for example, be exposed to (trimethyl)methylcyclopentadienyl platinum carried by He at a flowrate of about 100 sccm and $O_2$ at a flow of about 300 sccm for a period of time within a range of from about 2 seconds to about 30 seconds, such as about 8 seconds. The (trimethyl)methylcyclopentadienyl platinum may adsorb (e.g., chemisorb) to the surface of the dielectric material 108 to form a monolayer of (trimethyl) methylcyclopentadienyl platinum, and the $O_2$ may react with the monolayer of (trimethyl)methylcyclopentadienyl platinum to form the discrete Pt particles. Reaction byproducts and unreacted $O_2$ may be removed (e.g., evacuated from the ALD chamber containing the dielectric material 108). The above ALD cycle may be repeated from about 2 times to about 300 times to achieve a desired particle size and a desired distribution density of the discrete Pt particles, such as an aerial distribution density within a range of from about $5 \times 10^{11}$ particles/cm$^2$ to about $1 \times 10^{13}$ particles/cm$^2$. In addition, the ALD process may employ a substrate 102 temperature of from about 250° C. to about 320° C. (e.g., about 300° C.), and a pressure of about from about 0.05 Torr to about 0.09 Torr (e.g., about 0.07 Torr). In further embodiments, the above ALD process may be plasma-enhanced (e.g., plasma-assisted). By way of non-limiting example, the surface of the dielectric material 108 may be exposed to a 100 W plasma including Ar and $O_2$ at flowrates of about 100 sccm and about 300 sccm, respectively, for about 30 seconds, the flow of Ar may be stopped, the surface of the dielectric material 108 may be exposed to (trimethyl)methylcyclopentadienyl platinum carried by He at a flowrate of about 100 sccm (i.e., while maintaining the flow of $O_2$) for from about 2 seconds to about 30 seconds (e.g., about 8 seconds) to form the discrete Pt particles, and then reaction byproducts and unreacted $O_2$ may be removed. Optionally, following the formation of the discrete Pt particles, one or more additional processes (e.g., a plasma treatment process, an annealing process) may be used to modify at least one of the size, the shape, the material composition, and the distribution density of the discrete Pt particles.

In additional embodiments, discrete Rh particles are formed on at least one surface of the dielectric material 108 using an ALD process. By way of non-limiting example, the surface of the dielectric material 108 may be exposed to cyclopentadienyldicarbonyl rhodium to form the discrete Rh particles on the surface of the dielectric material 108. The surface of the dielectric material 108 may, for example, be exposed to cyclopentadienyldicarbonyl rhodium carried by He at a flowrate of about 50 sccm for a period of time within a range of from about 1 second to about 15 seconds, such as about 2 seconds. The cyclopentadienyldicarbonyl rhodium may react with the dielectric material 108 and form (e.g., adsorb, such as chemisorb) the discrete Rh particles on the surface of the dielectric material 108. Reaction byproducts gas may be removed (e.g., evacuated from the ALD chamber containing the dielectric material 108). The above ALD cycle may be repeated from about 2 times to about 300 times to achieve a desired particle size and a desired distribution density of the discrete Rh particles, such as an aerial distribution density within a range of from about $5 \times 10^{11}$ particles/cm$^2$ to about $1 \times 10^{13}$ particles/cm$^2$. In addition, the ALD process may employ a substrate 102 temperature of from about 250° C. to about 320° C. (e.g., about 300° C.), and a pressure of about from about 0.03 Torr to about 0.07 Torr (e.g., about 0.05 Torr). In further embodiments, the above ALD process may be plasma-enhanced (e.g., plasma-assisted). By way of non-limiting example, the surface of the dielectric material 108 may be exposed to a 60 W plasma including $O_2$ at a flowrate of about 300 sccm for about 30 seconds, the flow of $O_2$ may be stopped, the surface of the dielectric material 108 may be exposed to cyclopentadienyl-dicarbonyl rhodium carried by He at a flowrate of about 50 sccm for from about 1 second to about 15 seconds (e.g., about 2 seconds) to form the discrete Rh particles, and then reaction byproducts may be removed. Optionally, following the formation of the discrete Rh particles, one or more additional processes (e.g., a plasma treatment process, an annealing process) may be used to modify at least one of the size, the shape, the material composition, and the distribution density of the discrete Rh particles.

In further embodiments, discrete Ru particles are formed on at least one surface of the dielectric material 108 using an ALD process. By way of non-limiting example, the surface of the dielectric material 108 may be exposed to tricarbonyl (1,3-cyclo-hexadiene) ruthenium to form the discrete Ru particles on the surface of the dielectric material 108. The surface of the dielectric material 108 may, for example, be exposed to tricarbonyl(1,3-cyclo-hexadiene) ruthenium carried by He at a flowrate of about 50 sccm for a period of time within a range of from about 1 second to about 15 seconds, such as about 2 seconds. The tricarbonyl(1,3-cyclo-hexadiene) ruthenium may react with the dielectric material 108 and form (e.g., adsorb, such as chemisorb) the discrete Ru particles on the surface of the dielectric material 108. Reaction byproducts gas may then be removed (e.g., evacuated from the ALD chamber containing the dielectric material 108). The above ALD cycle may be repeated from about 2 times to about 300 times to achieve a desired particle size and a desired distribution density of the discrete Ru particles, such as an aerial distribution density within a range of from about $5 \times 10^{11}$ particles/cm$^2$ to about $1 \times 10^{13}$ particles/cm$^2$. In addition, the ALD process may employ a substrate 102 temperature of from about 250° C. to about 320° C. (e.g., about 300° C.), and a pressure of about from about 0.03 Torr to about 0.07 Torr (e.g., about 0.04 Torr). In further embodiments, the above ALD process may be plasma-enhanced (e.g., plasma-assisted). By way of non-limiting example, the surface of the dielectric material 108 may be exposed to a 60 W plasma including Ar at a flowrate of about 300 sccm for about 30 seconds, the flow of Ar may be stopped, the surface of the dielectric material 108 may be exposed to tricarbonyl(1,3-cyclo-hexadiene) ruthenium carried by He at a flowrate of about 50 sccm for from about 1 second to about 15 seconds (e.g., about 2 seconds) to form the discrete Ru particles, and then reaction byproducts may be removed. Optionally, following the formation of the discrete Ru particles, one or more additional processes (e.g., a plasma treatment process, an annealing process) may be used to modify at least one of the size, the shape, the material composition, and the distribution density of the discrete Ru particles.

In yet further embodiments, discrete Co particles are formed on at least one surface of the dielectric material 108 using an ALD process. By way of non-limiting example, the surface of the dielectric material 108 may be exposed to dicarbonylcyclopentadienyl cobalt and carbon monoxide (CO) to form the discrete Co particles on the surface of the dielectric material 108. The surface of the dielectric material 108 may, for example, be exposed to dicarbonylcyclopentadienyl cobalt carried by He at a flowrate of about 500 sccm and CO at a flow of about 500 sccm for a period of time within a range of from about 1 second to about 15 seconds, such as about 2 seconds. The dicarbonylcyclopentadienyl cobalt may adsorb (e.g., chemisorb) to the surface of the dielectric material 108 to form a monolayer of dicarbonylcyclopentadienyl cobalt, and the CO may react with the monolayer of dicarbonylcyclopentadienyl cobalt to form the discrete Co particles. Reaction byproducts and unreacted CO may then be removed (e.g., evacuated from the ALD chamber containing the dielectric material 108). The above ALD cycle may be repeated from about 2 times to about 300 times to achieve a desired particle size and a desired distribution density of the discrete Co particles, such as an aerial distribution density within a range of from about $5 \times 10^{11}$ particles/cm$^2$ to about $1 \times 10^{13}$ particles/cm$^2$. In addition, the ALD process may employ a substrate 102 temperature of from about 150° C. to about 240° C. (e.g., about 190° C.), and a pressure of about from about 0.03 Torr to about 0.07 Torr (e.g., about 0.05 Torr). Optionally, following the formation of the discrete Co particles, one or more additional processes (e.g., a plasma treatment process, an annealing process) may be used to modify at least one of the size, the shape, the material composition, and the distribution density of the discrete Co particles.

Therefore, in accordance with embodiments of the disclosure, a method of forming a memory cell material comprises forming a first portion of a dielectric material over a substrate by atomic layer deposition. Discrete conductive particles are formed on the first portion of the dielectric material by atomic layer deposition. A second portion of the dielectric material is formed on and between the discrete conductive particles by atomic layer deposition.

Furthermore, in accordance with additional embodiments of the disclosure, a method of forming a semiconductor device structure comprises forming a memory cell material on a substrate by atomic layer deposition, the memory cell material comprising discrete conductive particles interposed between at least two vertically adjacent portions of a dielectric material.

Figure 2:
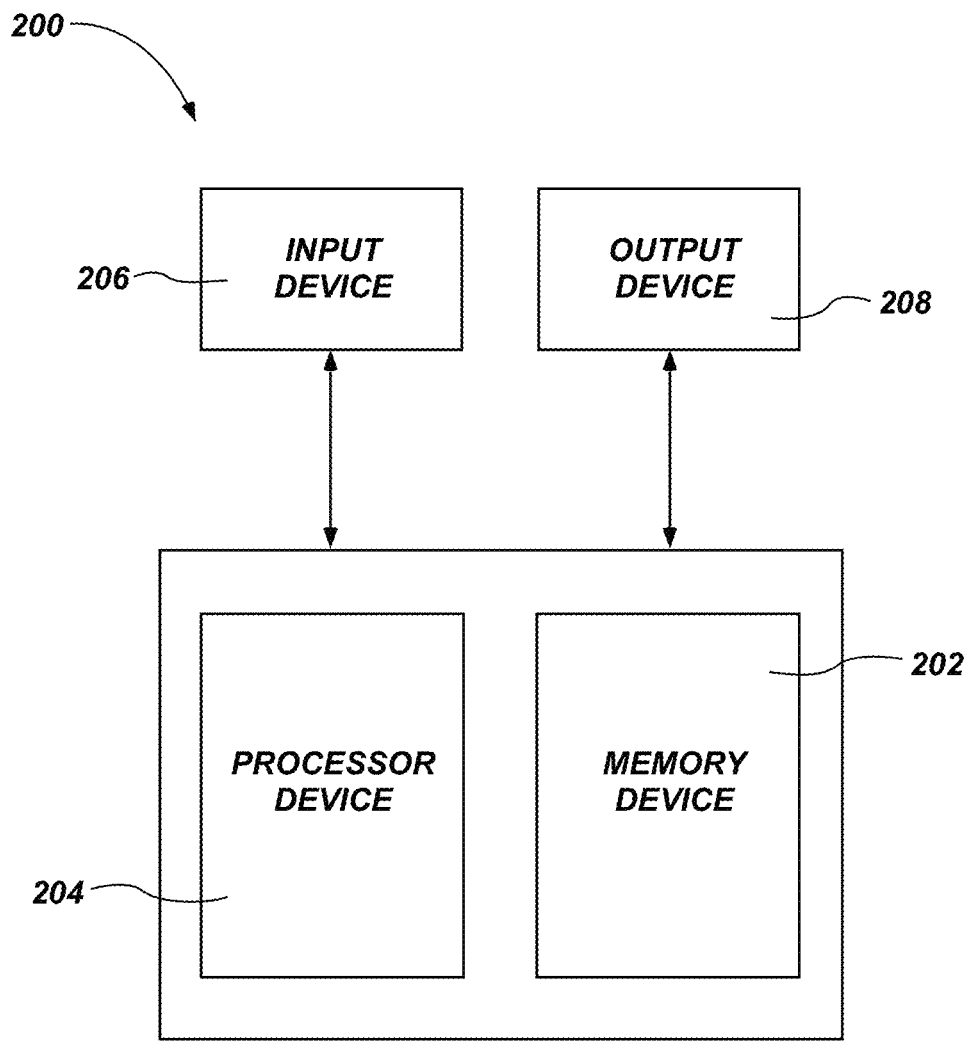
FIG. 2 is a schematic block diagram illustrating an electronic system in accordance with embodiments of the disclosure.

The semiconductor device structure 100 including the memory cell material 104 may be used in a wide variety of semiconductor devices including, but not limited to, memory devices (e.g., resistive memory devices, such as RRAM devices). Semiconductor devices that include the semiconductive device structure 100 in accordance with embodiments of the disclosure may included in a variety of electronic systems. For example, FIG. 2 is a block diagram of an electronic system 200 according to embodiments of disclosure. The electronic system 200 may comprise, for example, a computer or computer hardware component, a server or other networking hardware component, a cellular telephone, a digital camera, a personal digital assistant (PDA), portable media (e.g., music) player, etc. The electronic system 200 includes at least one memory device 202. The electronic system 200 may further include at least one electronic signal processor device 204 (often referred to as a "microprocessor"). At least one of the memory device 202 and the electronic signal processor device 204 may include, for example, an embodiment of the semiconductor device structure 100 previously described with respect to FIG. 1. Accordingly, at least one of the memory device 202 and the electronic signal processor device 204 may include an embodiment of the memory cell material 104, including the discrete conductive particles 106 and the dielectric material 108. The electronic system 200 may further include one or more input devices 206 for inputting information into the electronic system 200 by a user, such as, for example, a mouse or other pointing device, a keyboard, a touchpad, a button, or a control panel. The electronic system 200 may further include one or more output devices 208 for outputting information (e.g., visual or audio output) to a user such as, for example, a monitor, a display, a printer, an audio output jack, a speaker, etc. In some embodiments, the input device 206 and the output device 208 may comprise a single touch screen device that can be used both to input information to the system 200 and to output visual information to a user. The one or more input devices 206 and output devices 208 may communicate electrically with at least one of the memory device 202 and the electronic signal processor device 204.

The methods of the disclosure facilitate the controlled formation of a memory cell material 104 including conductive particles 106 exhibiting desired material compositions, particle sizes, and distribution densities. In turn, the controlled formation of the memory cell material 104 facilitates the formation of a semiconductor device structure 100, a semiconductor device (e.g., the memory device 202, the electronic signal processor device 204), and a system (e.g., the electronic system 200) exhibiting desired electrical properties, excellent performance, and excellent stability. The methods of the disclosure facilitate the efficient formation of memory cell materials 104 including different materials (e.g., different dielectric materials and/or different conductive particles) having distinct and identifiable boundaries therebetween (e.g., between the distinct conductive particles and the dielectric material(s); between different dielectric materials). In some embodiments, the distinct conductive particles 106 may be formed from conductive material precursors without the use of a reactant gas and/or plasma treatment process, thereby reducing process costs and increasing process efficiency. The methods and structures of the disclosure facilitate the effective scaling of various semiconductor device structures, such as the scaling of memory cells down to sub-20 nm dimensions.

The following examples serve to explain embodiments of the disclosure in more detail. The examples are not to be construed as being exhaustive or exclusive as to the scope of the disclosure. While Examples 1 and 2 describe discrete Pt particles, other discrete conductive particles (e.g., discrete Ru particles, discrete Ta particles, discrete Rh particles, discrete Cu particles, discrete Al particles, discrete Co particles) may be formed by appropriately selecting the conductive material precursor and the conductive-material-forming reactant (if any), as previously described above.

EXAMPLES

Example 1

Pt Particle Size and Distribution Density Based on ALD Duration

The effect of ALD duration on the average particle size and the distribution density of discrete Pt particles was analyzed. Aluminum oxide was formed over a substrate using the ALD-based dielectric formation processes of the disclosure, and then discrete Pt particles were formed on the aluminum oxide using the ALD-based conductive particle formation processes of the disclosure. For one test, the aluminum oxide was formed using 8 ALD cycles each employing TMA and ozone, and, for the additional tests, the aluminum oxide was formed using 8 ALD cycles each employing TMA and water. The discrete Pt particles were formed on the aluminum oxide by evacuating a chamber containing the aluminum oxide for about 30 seconds, exposing the aluminum oxide to a 100 W plasma including Ar and $O_2$ at flowrates of about 100 sccm and about 300 sccm, respectively, for about 30 seconds, stopping the flow of Ar, and then exposing the aluminum oxide to (trimethyl)methylcyclopentadienyl platinum carried by He at a flowrate of about 100 sccm (i.e., while maintaining the flow of $O_2$). A substrate holder (e.g., chuck) with a temperature setpoint of 300° C., and a chamber pressure of about 0.07 Torr were utilized to form the discrete Pt particles.

Figure 3A:
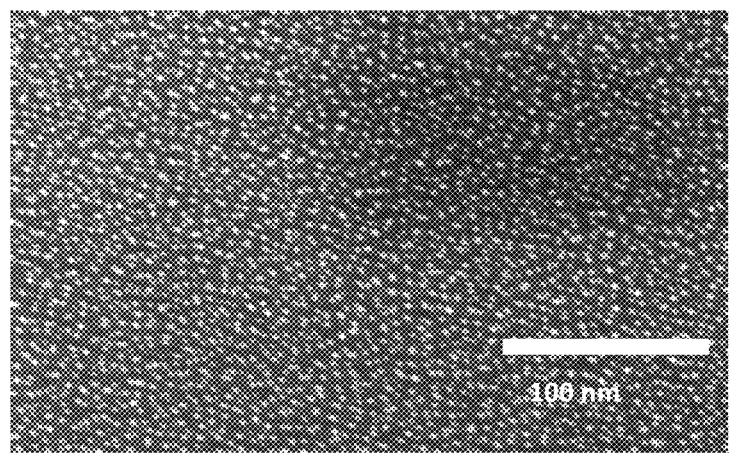
FIGS. 3A through 3C are scanning electron micrographs of discrete conductive particles formed on a dielectric material in accordance with embodiments of the disclosure, as described below in Example 1.
Figure 3B:
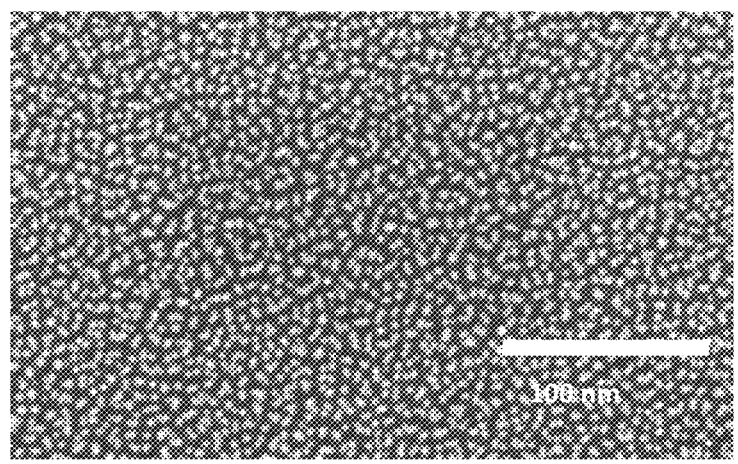
Figure 3C:
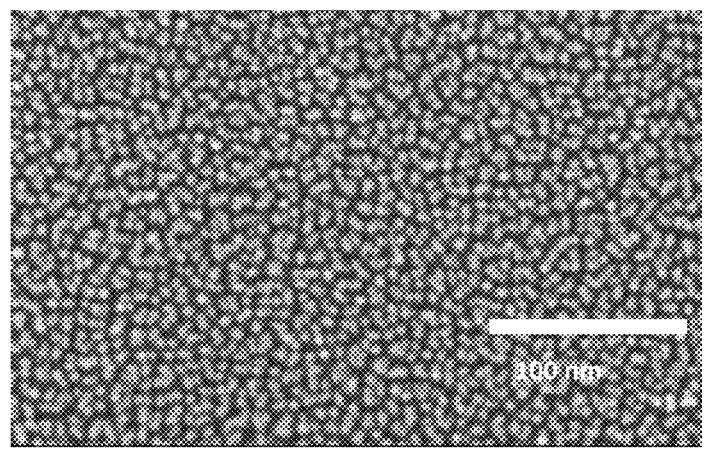

FIG. 3A is a scanning electron micrograph (SEM) of discrete Pt particles formed in a center region of deposition on aluminum oxide formed using an ALD process employing TMA and ozone for a 5 second (trimethyl)methylcyclopentadienyl platinum exposure duration. FIG. 3B is an SEM of discrete Pt particles formed in a center region of deposition on aluminum oxide formed using an ALD process employing TMA and water for an 8 second (trimethyl)methylcyclopentadienyl platinum exposure duration. FIG. 3C is an SEM of discrete Pt particles formed in a center region of deposition on aluminum oxide formed using an ALD process employing TMA and water for a 25 second (trimethyl)methylcyclopentadienyl platinum exposure duration. As shown in FIGS. 3A through 3C, the average particle size and the distribution density of the discrete Pt particles increased with increased (trimethyl)methylcyclopentadienyl platinum exposure duration.

Example 2

Sample Memory Cell Material

Figure 4:
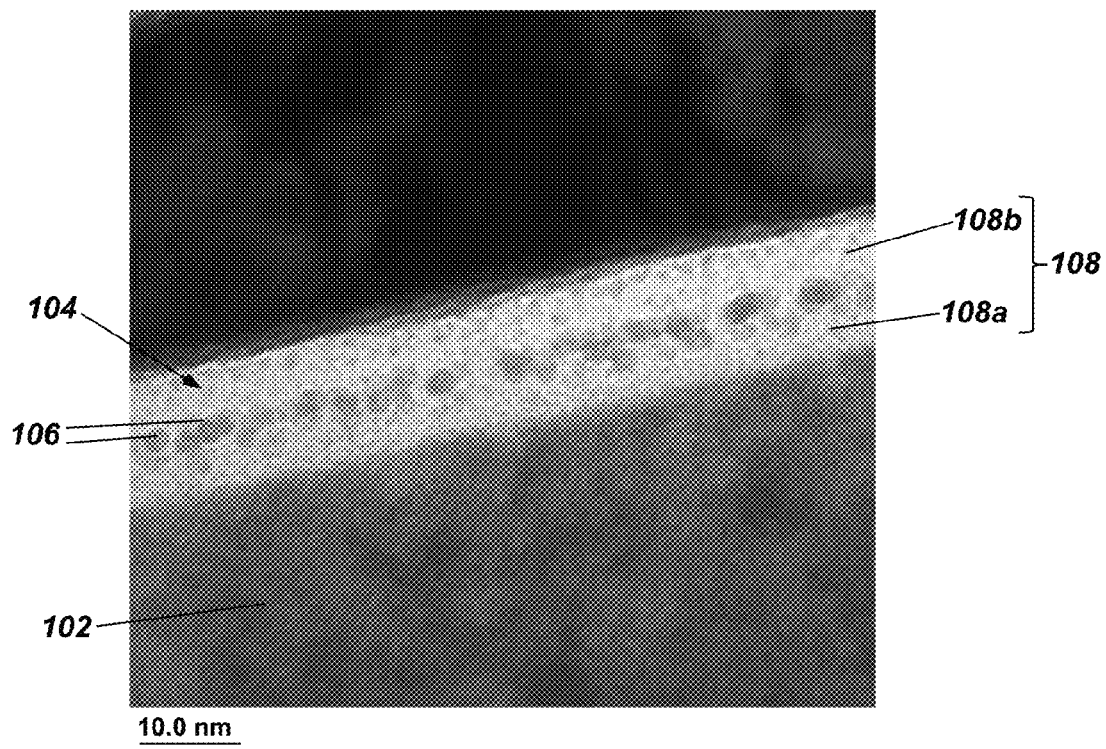
FIG. 4 is a transmission electron micrograph showing a partial cross-sectional view of a memory cell material formed in accordance with embodiments of the disclosure, as described below in Example 2.

A memory cell material 104 formed by an ALD-based formation process of an embodiment of the disclosure was subjected to morphology analysis. The memory cell material 104 included a dielectric material 108 having a first portion 108a and a second portion 108b. Each of the first portion 108a and the second portion 108b comprised aluminum oxide formed using the ALD-based dielectric formation processes of the disclosure. Each of the ALD-based dielectric formation processes employed 8 ALD cycles each utilizing TMA and water. Discrete conductive particles 106 were interposed between the first portion 108a and the second portion 108b of the dielectric material 108. The discrete conductive particles 106 comprised discrete Pt particles formed using one of the ALD-based conductive particle formation processes of the disclosure. The ALD-based conductive particle formation process was substantially similar to that described in Example 1. FIG. 4 is a transmission electron micrograph (TEM) showing a partial cross-sectional view of the memory cell material 104. FIG. 4 illustrates that the memory cell material 104 included discrete conductive particles 106 exhibiting distinct boundaries dispersed throughout the dielectric material 108.

While the disclosure is susceptible to various modifications and alternative forms, specific embodiments have been shown by way of example in the drawings and have been described in detail herein. However, the disclosure is not intended to be limited to the particular forms disclosed. Rather, the disclosure encompasses all modifications, equivalents, and alternatives falling within the scope of the following appended claims and their legal equivalents.

What is claimed is:

1. A method of forming a memory cell material, comprising:
    forming a first portion of a dielectric nitride material over a substrate by atomic layer deposition; forming discrete, substantially uniformly spaced conductive particles on the first portion of the dielectric nitride material by atomic layer deposition; and
    forming a second portion of the dielectric nitride material on and between the discrete, substantially uniformly shaped conductive particles by atomic layer deposition;
    forming additional discrete, substantially uniformly spaced conductive particles on the second portion of the dielectric nitride material by atomic layer deposition, at least some of the additional discrete, substantially uniformly spaced conductive particles exhibiting substantially the same size as at least some of the discrete, substantially uniformly spaced conductive particles most proximate thereto but completely laterally offset from the at least some of the discrete, substantially uniformly spaced conductive particles; and forming a third portion of the dielectric nitride material on and between the additional discrete, substantially uniformly spaced conductive particles by atomic layer deposition.

2. The method of claim 1, wherein forming a first portion of a dielectric nitride material over a substrate by atomic layer deposition comprises:
adsorbing a dielectric nitride material precursor to a surface of the substrate to form a monolayer of the dielectric nitride material precursor; and
exposing the monolayer of the dielectric nitride material precursor to at least one reactant to convert the monolayer of the dielectric nitride material precursor into a monolayer of the dielectric nitride material.

3. The method of claim 2, further comprising forming at least one additional monolayer of the dielectric nitride material over the monolayer of the dielectric nitride material before forming the discrete, substantially uniformly spaced conductive particles.

4. The method of claim 1, wherein forming discrete, substantially uniformly spaced conductive particles on the first portion of the dielectric nitride material by atomic layer deposition comprises:
adsorbing a conductive material precursor to a surface of the first portion of the dielectric nitride material; and
exposing the adsorbed conductive material precursor to at least one of a reactant and additional conductive material precursor to convert the adsorbed conductive material precursor into the discrete, substantially uniformly spaced conductive particles.

5. The method of claim 4, wherein adsorbing a conductive material precursor to a surface of the first portion of the dielectric nitride material comprises chemisorbing at least one of ethylcyclopentadienyldicarbonyl ruthenium, tetrakis (dimethylamido) tantalum, cupric hexafluoroacetylacetonate, cupric (N,N' diisopropyl 2-dimethylamine amidinate), tris-hexamethyldisilazane aluminum, diethyl aluminum chloride, dimethylaluminum hydride, and tetrakis(dimethylamido) aluminum to the surface of the first portion of the dielectric nitride material.

6. The method of claim 1, further comprising modifying at least one of an average particle size and a distribution density of the discrete, substantially uniformly spaced conductive particles prior to the forming the additional discrete, substantially uniformly spaced conductive particles.

7. The method of claim 6, wherein modifying at least one of an average particle size and a distribution density of the discrete, substantially uniformly spaced conductive particles comprises exposing the discrete, substantially uniformly spaced conductive particles to additional conductive material precursor prior to forming the additional discrete, substantially uniformly spaced conductive particles.

8. The method of claim 7, further comprising exposing the discrete, substantially uniformly spaced conductive particles to at least one reactant after exposing the discrete, substantially uniformly spaced conductive particles to the additional conductive material precursor.

9. The method of claim 1, wherein forming a second portion of the dielectric nitride material on and between the discrete, substantially uniformly spaced particles by atomic layer deposition comprises:
adsorbing a dielectric nitride material precursor to the discrete, substantially uniformly spaced conductive particles and to exposed portions of the surface of the first portion of the dielectric nitride material to form a monolayer of the dielectric nitride material precursor; and
exposing the monolayer of the dielectric nitride material precursor to at least one reactant to convert the monolayer of the dielectric nitride material precursor into a monolayer of the dielectric nitride material.

10. The method of claim 9, further comprising forming at least one additional monolayer of the dielectric nitride material over the monolayer of the dielectric nitride material.

11. The method of claim 1, wherein forming additional discrete, substantially uniformly spaced conductive particles on the second portion of the dielectric nitride material by atomic layer deposition comprises forming the additional discrete, substantially uniformly spaced conductive particles to exhibit at least one of a different material composition and a different distribution density than the discrete, substantially uniformly spaced conductive particles.

12. The method of claim 11, wherein forming the additional discrete, substantially uniformly spaced conductive particles to exhibit at least one of a different material composition and a different distribution density than the discrete, substantially uniformly spaced conductive particles comprises forming the additional discrete, substantially uniformly spaced conductive particles to comprise a different metal material than the discrete, substantially uniformly spaced conductive particles.

13. The method of claim 1, wherein forming a first portion of a dielectric nitride material over a substrate by atomic layer deposition comprises forming silicon nitride over the substrate by atomic layer deposition.

14. The method of claim 13, wherein forming a second portion of the dielectric nitride material on and between the discrete, substantially uniformly spaced conductive particles by atomic layer deposition comprises forming additional silicon nitride directly on the discrete, substantially uniformly spaced conductive particles and the first portion of the dielectric nitride material by atomic layer deposition.

15. The method of claim 14, wherein forming additional silicon nitride directly on the discrete, substantially uniformly spaced conductive particles and the first portion of a dielectric nitride material by atomic layer deposition comprises:
adsorbing a silicon nitride precursor to surfaces of the discrete, substantially uniformly spaced conductive particles and the first portion of the dielectric nitride material to form a monolayer of the silicon nitride precursor; and
exposing the monolayer of the silicon nitride precursor to at least one nitridizing agent to convert the monolayer of the silicon nitride precursor into a monolayer of silicon nitride.

16. The method of claim 15, wherein adsorbing a silicon nitride precursor to surfaces of the discrete, substantially uniformly spaced conductive particles and the first portion of the dielectric nitride material comprises adsorbing hexachlorodisilane to the surfaces of the discrete, substantially uniformly spaced conductive particles and the first portion of the dielectric nitride material.

17. The method of claim 16, wherein exposing the monolayer of the silicon nitride precursor to at least one nitridizing agent to convert the monolayer of the silicon nitride precursor into a monolayer of the silicon nitride comprises exposing the adsorbed hexachlorodisilane to one or more of ammonia and hydrazine.

18. The method of claim 1, wherein forming discrete, substantially uniformly spaced conductive particles on the first portion of the dielectric nitride material by atomic layer deposition comprises:
adsorbing a conductive material precursor to a surface of the first portion of the dielectric nitride material; and
exposing the adsorbed conductive material precursor to a reducing reactant formulated to react with the adsorbed conductive material precursor and form the discrete, substantially uniformly spaced conductive particles.

19. The method of claim 18, wherein exposing the adsorbed conductive material precursor to a reducing reactant comprises exposing the adsorbed conductive material precursor to one or more of formic acid, oxalic acid, and hydrogen.

20. The method of claim 1, wherein forming discrete, substantially uniformly spaced conductive particles on the first portion of the dielectric nitride material by atomic layer deposition comprises:
adsorbing a conductive material precursor to a surface of the first portion of the dielectric nitride material; and
exposing the adsorbed conductive material precursor to an oxidizing reactant formulated to react with the adsorbed conductive material precursor and form the discrete, substantially uniformly spaced conductive particles.

21. The method of claim 20, wherein exposing the adsorbed conductive material precursor to an oxidizing reactant comprises exposing the adsorbed conductive material precursor to one or more of ozone, hydrogen peroxide, and nitrous oxide.

22. The method of claim 1, wherein forming discrete, substantially uniformly spaced conductive particles on the first portion of the dielectric nitride material by atomic layer deposition comprises:
adsorbing a conductive material precursor to a surface of the first portion of the dielectric nitride material; and
exposing the adsorbed conductive material precursor to additional conductive material precursor having a ligand formulated to react with a ligand of the adsorbed conductive material precursor and form the discrete, substantially uniformly spaced conductive particles without the use of another reactant.

23. A method of forming a semiconductor device structure, comprising:
forming a memory cell material on a substrate by atomic layer deposition, the memory cell material comprising discrete, substantially uniformly sized conductive particles interposed between at least two vertically adjacent portions of a dielectric material,
a first portion the discrete, substantially uniformly sized conductive particles adsorbed to a first of the at least two vertically adjacent portions of the dielectric material, and
a second portion of the discrete, substantially uniformly sized conductive particles adsorbed to a second of the at least two vertically adjacent portions of the dielectric material, none of the discrete, substantially uniformly sized conductive particle of the second portion substantially laterally overlapping any of the discrete, substantially uniformly spaced conductive particles of the first portion.

24. The method of claim 23, wherein forming a memory cell material comprising discrete, substantially uniformly sized conductive particles interposed between at least two vertically adjacent portions of a dielectric material comprises forming the first portion of the discrete, substantially uniformly sized conductive particles to comprise a different metal material than the second portion of the discrete, substantially uniformly sized conductive particles.

25. The method of claim 23, wherein forming a memory cell material on a substrate by atomic layer deposition comprises forming the discrete, substantially uniformly spaced conductive particles on at least one surface of the at least two vertically adjacent portions of the dielectric material by a non-plasma-assisted atomic layer deposition process.

26. The method of claim 23, wherein forming a memory cell material on a substrate by atomic layer deposition comprises performing at least one plasma treatment process to form the discrete, substantially uniformly sized conductive particles on at least one surface of the at least two vertically adjacent portions of the dielectric material.

27. The method of claim 23, wherein forming a memory cell material on a substrate by atomic layer deposition comprises forming the discrete, substantially uniformly spaced conductive particles to be substantially free of oxygen.

28. A method of forming a semiconductor device structure, comprising:
forming a first of at least two vertically adjacent portions of a dielectric material on a surface of a substrate;
exposing the first of the at least two vertically adjacent portions of the dielectric material to a conductive material precursor comprising a metal and at least one ligand to form a monolayer of the conductive material precursor;
exposing the monolayer of the conductive material precursor to a reducing reactant to form discrete conductive particles;
forming a second of the at least two vertically adjacent portions of the dielectric material on exposed surfaces of the discrete conductive particles;
exposing the second of the at least two vertically adjacent portions of the dielectric material to an additional conductive material precursor comprising the metal and at least one additional ligand having a different molecular weight than the at least one ligand of the conductive material precursor to form a monolayer of the additional conductive material precursor; and
exposing the monolayer of the additional conductive material precursor to a reducing reactant to form additional discrete conductive particles substantially misaligned with the discrete conductive particles.

* * * * *

UNITED STATES PATENT AND TRADEMARK OFFICE
CERTIFICATE OF CORRECTION

PATENT NO. : 9,735,359 B2  
APPLICATION NO. : 14/259556  
DATED : August 15, 2017  
INVENTOR(S) : Gurtej S. Sandhu and John A. Smythe Page 1 of 1

It is certified that error appears in the above-identified patent and that said Letters Patent is hereby corrected as shown below:

In the Claims  
Claim 1, Column 24, Lines 64-65, change "uniformly shaped conductive" to --uniformly spaced conductive--

Signed and Sealed this  
Third Day of October, 2017

Joseph Matal  
*Performing the Functions and Duties of the*  
*Under Secretary of Commerce for Intellectual Property and*  
*Director of the United States Patent and Trademark Office*